US009025099B2

(12) United States Patent
Kwon et al.

(10) Patent No.: US 9,025,099 B2
(45) Date of Patent: May 5, 2015

(54) LIQUID CRYSTAL DISPLAY DEVICE AND METHOD FOR FABRICATING THE SAME

(71) Applicant: LG Display Co., Ltd., Seoul (KR)

(72) Inventors: Eun-Mi Kwon, Paju-si (KR); Jung-Bum Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 13/688,006

(22) Filed: Nov. 28, 2012

(65) Prior Publication Data

US 2013/0148050 A1  Jun. 13, 2013

(30) Foreign Application Priority Data

Dec. 7, 2011  (KR) ........................ 10-2011-0130497

(51) Int. Cl.
  *G02F 1/1333*  (2006.01)
  *G02F 1/1345*  (2006.01)
  *G02F 1/1362*  (2006.01)
  *H01L 33/00*  (2010.01)

(52) U.S. Cl.
  CPC ........ *G02F 1/136204* (2013.01); *H01L 33/005* (2013.01); *G02F 1/13458* (2013.01)

(58) Field of Classification Search
  CPC ........................ G02F 1/136204; G02F 1/1345
  USPC .................................... 349/40, 149, 151, 152
  See application file for complete search history.

(56) References Cited

U.S. PATENT DOCUMENTS

| 2008/0106661 A1* | 5/2008 | Kim et al. .................. 349/40 |
| 2010/0033664 A1* | 2/2010 | Lee ............................. 349/139 |
| 2010/0053489 A1* | 3/2010 | Kang et al. .................. 349/48 |
| 2012/0069260 A1* | 3/2012 | Misaki ......................... 349/43 |

FOREIGN PATENT DOCUMENTS

| CN | 101114412 A | 1/2008 |
| CN | 101441372 A | 5/2009 |
| CN | 101556387 A | 10/2009 |
| CN | 201845768 U | 5/2011 |
| TW | 201009467 A | 3/2010 |

OTHER PUBLICATIONS

State Intellectual Property Office of the People's Republic of China, First Office Action, Chinese Patent Application No. 201210501140. 8, Jan. 27, 2015, thirteen pages.

* cited by examiner

*Primary Examiner* — Dennis Y Kim
(74) *Attorney, Agent, or Firm* — Fenwick & West LLP

(57) ABSTRACT

A liquid crystal display device to reduce damage of signal lines and switching devices caused by electrostatic discharge shock. The liquid crystal display device includes a plurality of pixels defined by intersections between gate lines and data lines, dummy pixels disposed along circumferences of the pixels, common lines disposed parallel to the gate lines, the common lines being connected to the pixels and the dummy pixels, a first gate metal to receive an exterior common voltage, second gate metals that extend from the common lines to one side, the second gate metals having a pad shape, a source-drain metal disposed in a direction parallel to the data lines at one side of the second gate metals, a first connection pattern to electrically connect the first gate metal to the source-drain metal, and a second connection pattern to electrically connect the source-drain metal to the second gate metals.

6 Claims, 5 Drawing Sheets

LIQUID CRYSTAL DISPLAY DEVICE AND METHOD FOR FABRICATING THE SAME

CROSS-REFERENCE TO RELATED APPLICATIONS

This application claims priority to Korean Patent Application No. 10-2011-0130497 filed on Dec. 7, 2011, which is incorporated by reference herein in its entirety.

BACKGROUND OF THE INVENTION

1. Field of the Invention

The present invention relates to a liquid crystal display device, and more particularly, to a liquid crystal display device and a method for fabricating the same to reduce damage of signal lines and switching devices caused by electrostatic discharge (ESD) shock.

2. Discussion of the Related Art

In general, a liquid crystal display device includes an anti-electrostatic discharge circuit disposed in a non-display region where an image is not displayed in order to prevent introduction of electrostatic discharge (ESD) into pixels. The anti-electrostatic discharge circuit is disposed in an introduction part of gate lines to apply a scan signal to pixels and an introduction part of data lines to apply a data voltage to the pixels. Such an anti-electrostatic discharge circuit passes electrostatic discharge introduced into the data lines or gate lines to common lines and electrostatic discharge introduced into the common lines flows to the gate or data lines.

Meanwhile, in recent years, a liquid crystal display device is designed to have a smaller width of gate and data lines and a smaller size of switching devices in accordance with trends toward high resolution and increase in size. These behaviors mean that gate and data lines and switching devices become more vulnerable to electrostatic discharge shock. Accordingly, there is a need for technologies capable of more efficiently protecting the gate lines and data lines and switching devices in pixels from electrostatic discharge shock.

SUMMARY OF THE INVENTION

Accordingly, the present invention is directed to a liquid crystal display device and a method for fabricating the same that substantially obviate one or more problems due to limitations and disadvantages of the related art.

An object of the present invention is to provide a liquid crystal display device and a method for fabricating the same, to reduce damage of signal lines and switching devices caused by electrostatic discharge shock.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device includes: a plurality of pixels defined by intersections between a plurality of gate lines and a plurality of data lines; a plurality of dummy pixels disposed along circumferences of the pixels; a plurality of common lines disposed parallel to the gate lines, the common lines being connected to the pixels and the dummy pixels; a first gate metal to receive an exterior common voltage; a plurality of second gate metals that extend from the common lines to one side, the second gate metals having a pad shape; a source-drain metal disposed in a direction parallel to the data lines at one side of the second gate metals; a first connection pattern to electrically connect the first gate metal to the source-drain metal; and a second connection pattern to electrically connect the source-drain metal to the second gate metals.

The liquid crystal display device may further include: a plurality of third gate metals that extend from the common lines to the other side, the third gate metals having a pad shape; and a third connection pattern to electrically connect the first gate metal to the third gate metals.

The first to third gate metals and the common lines may be formed of the same material in the same layer as the gate lines.

The source-drain metal may be formed of the same material in the same layer as the data lines.

The first to third connection patterns may be formed of the same material in the same layer as the pixel electrode provided in the pixels.

The liquid crystal display device may further include: a dummy data line formed parallel to the data lines so as to be adjacent to the first and last data lines; a dummy common line that branches from the first gate metals in a direction parallel to the gate lines, the dummy common line intersecting the data lines and the dummy data line; a first anti-electrostatic discharge circuit interposed between the data lines and the dummy common line, the first anti-electrostastic discharge circuit being connected thereto; a second anti-electrostatic discharge circuit interposed between the dummy common line and the first gate metal, the second anti-electrostatic discharge circuit being connected thereto; and a third anti-electrostatic discharge circuit interposed between the dummy data line and the dummy common line, the third anti-electrostatic discharge circuit being connected thereto, wherein the dummy data line is disposed between the second and third anti-electrostatic discharge circuits.

The liquid crystal display device may further include: a fourth anti-electrostatic discharge circuit interposed between the gate lines and the source-drain metal, the fourth anti-electrostatic discharge circuit being connected thereto.

In another aspect of the present invention, a method for fabricating a liquid crystal display device includes: forming a plurality of gate lines and a plurality of data lines intersecting each other on a substrate, to define a plurality of pixel regions; forming a plurality of pixels, each including a thin film transistor and a pixel electrode, in the pixel regions; forming a plurality of dummy pixels along the circumferences of the pixels; forming a plurality of common lines disposed parallel to the gate lines and connected to the pixels and the dummy pixels, and a plurality of second gate metals that extend from the common lines to one side and have a pad shape; forming a first gate metal electrically connected to a pad unit, to receive an exterior common voltage; forming a source-drain metal disposed in a direction parallel to the data lines at one side of the second gate metals; and forming a first connection pattern to electrically connect the first gate metal to the source-drain metal, and a second connection pattern to electrically connect the source-drain metal and the second gate metals.

The method may further include: forming a plurality of third gate metals that extend from the common lines to the other side and have a pad shape; and forming a third connection pattern to electrically connect the first gate metal to the third gate metals.

The first to third gate metals and the common lines may be formed of the same material in the same layer as the gate lines.

The source-drain metal may be formed of the same material in the same layer as the data lines.

The first to third connection patterns may be formed of the same material in the same layer as the pixel electrode.

The method may further include: forming a dummy data line parallel to the data lines such that the dummy data line is adjacent to the first and last data lines; forming a dummy common line such that the dummy common line branches from the first gate metals in a direction parallel to the gate lines and intersects the data lines and the dummy data line; forming a first anti-electrostatic discharge circuit such that the first anti-electrostatic discharge circuit is interposed between the data lines and the dummy common line and is connected thereto; forming a second anti-electrostatic discharge circuit such that the second anti-electrostatic discharge circuit is interposed between the dummy common line and the first gate metals and is connected thereto; and forming a third anti-electrostatic discharge circuit such that the third anti-electrostatic discharge circuit is interposed between the dummy data line and the dummy common line and is connected thereto, wherein the dummy data line is disposed between the second and third anti-electrostatic discharge circuits.

The method may further include: forming a fourth anti-electrostatic discharge circuit such that the fourth anti-electrostatic discharge circuit is disposed between the gate lines and the source-drain metal and is connected thereto.

The first to fourth anti-electrostatic discharge circuits may be simultaneously formed with the thin film transistor provided in the pixel region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a liquid crystal display device and a method for fabricating the same according to one embodiment of the present invention will be described in detail with reference to the annexed drawings.

Figure 1:
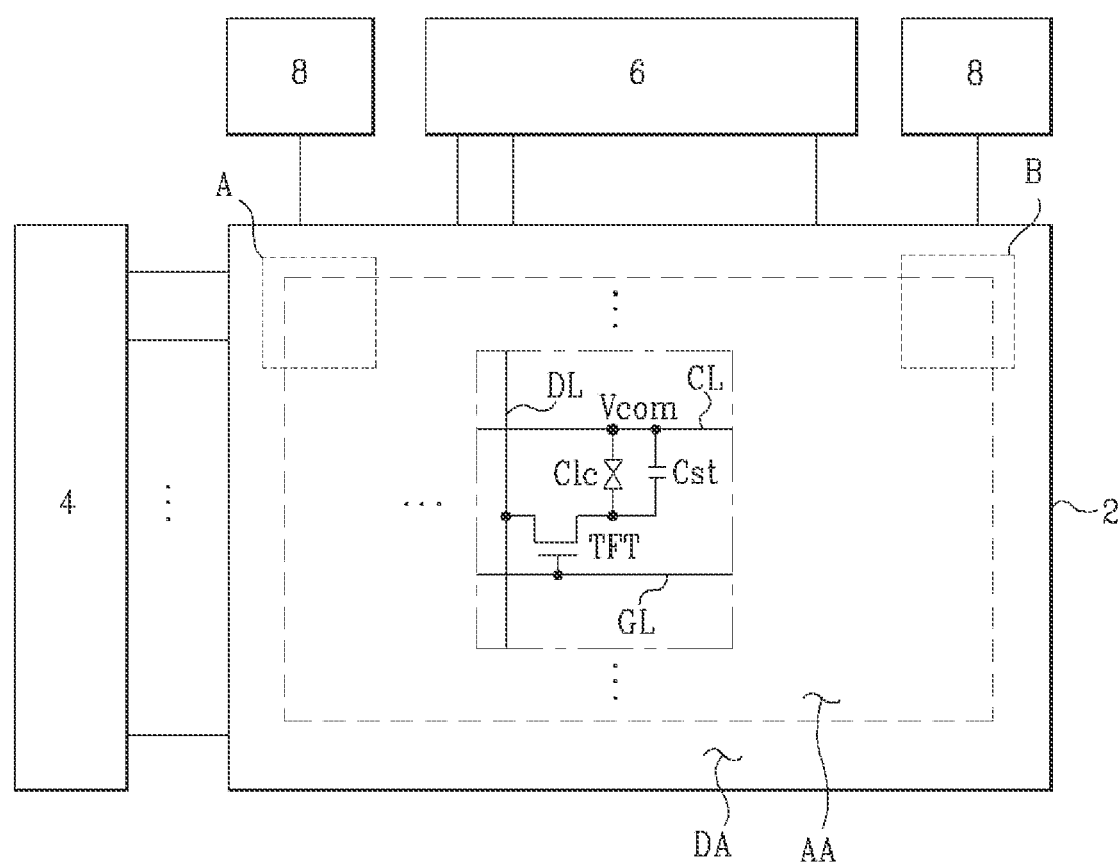
FIG. 1 is a block diagram illustrating a liquid crystal display device according to one embodiment of the present invention.

FIG. 1 is a block diagram illustrating a liquid crystal display device according to one embodiment of the present invention. The liquid crystal display device shown in FIG. 1 includes a liquid crystal panel 2, a gate driver 4, a data driver 6 and a common voltage supplier 8.

The liquid crystal panel 2 defines a display region AA where an image is displayed, and a dummy region DA, an outer area of the display region AA.

A plurality of pixels P arrayed in a matrix form is disposed in the display region AA. The pixels P are disposed in pixel regions. The pixel regions are defined by intersections between a plurality of gate lines GL and a plurality of data lines DL. Each pixel P includes a thin film transistor TFT, a liquid crystal capacitor Clc and a storage capacitor Cst. The liquid crystal capacitor Clc drives a liquid crystal according to an electric field generated by difference in voltage between a data voltage supplied to the pixel electrode through the thin film transistor TFT, and a common voltage Vcom supplied to the common electrode through the common line CL. The storage capacitor Cst maintains the data voltage supplied to the pixel electrode for a predetermined period of time.

A plurality of dummy pixels DP1 and DP2 that do not display an image are disposed in the dummy region DA. The dummy pixels DP1 and DP2 are disposed along the circumference of pixels P disposed in the display region AA. Meanwhile, first to third gate metals 10, 12 and 14 supplying a common voltage Vcom from the common voltage supplier 8 to a plurality of common lines CL, a source-drain metal 16 and a plurality of anti-electrostatic discharge circuits protecting signal lines and the thin film transistors TFT provided in the pixels P from exterior electrostatic discharge are disposed in the dummy region DA (see FIGS. 2 and 3).

The gate driver 4 sequentially supplies scan signals to the gate lines GL. The scan signal is a pulse signal having one value of a gate-on voltage to turn on the thin film transistor TFT included in the pixel region and a gate-off voltage to turn off the thin film transistor TFT.

The data driver 6 converts image data supplied from the outside into a data voltage using a standard gamma voltage and supplies the converted data voltage to the data lines DL.

Figure 2:
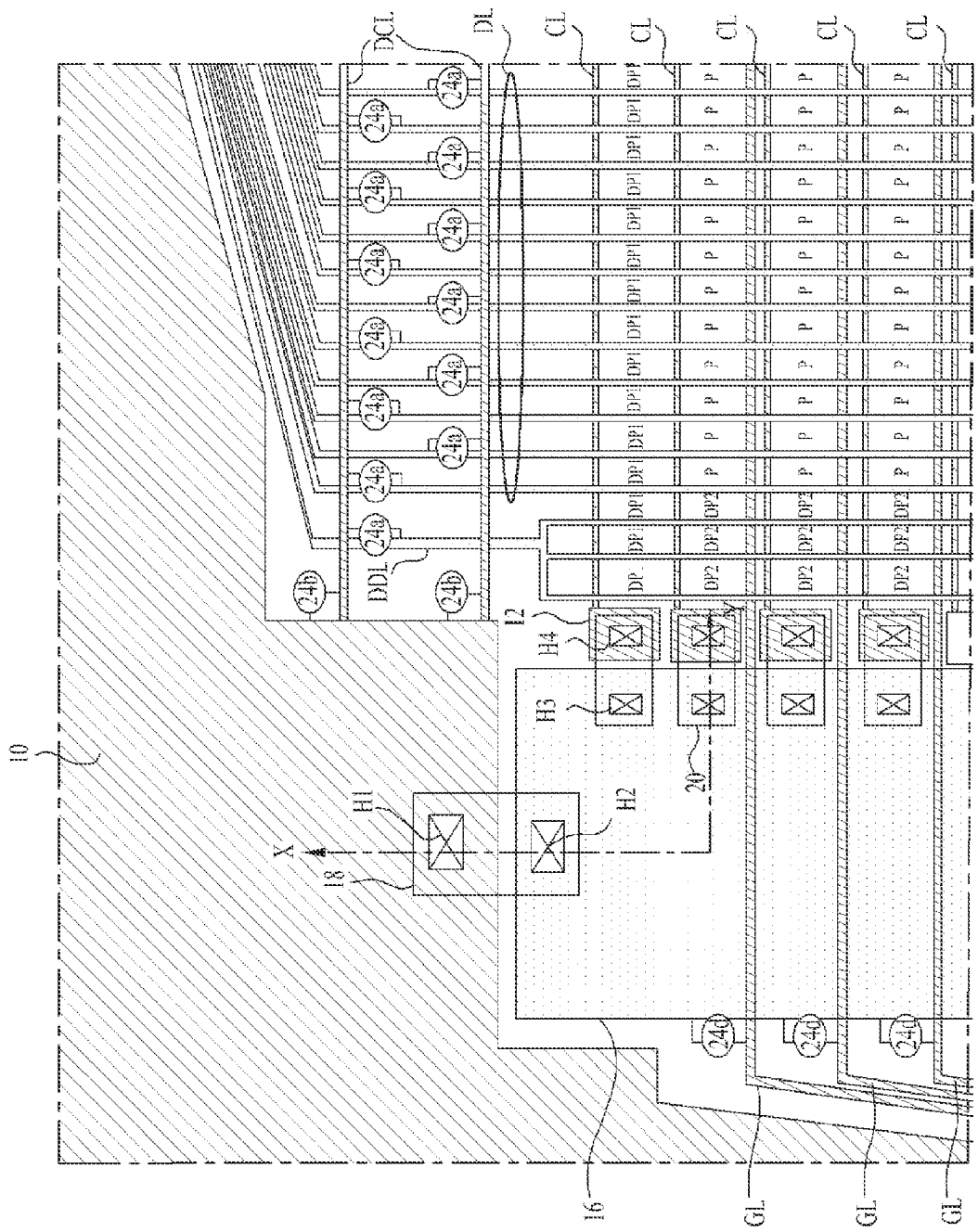
FIG. 2 is an enlarged view illustrating a region A of the liquid crystal panel 2 shown in FIG. 1.
Figure 3:
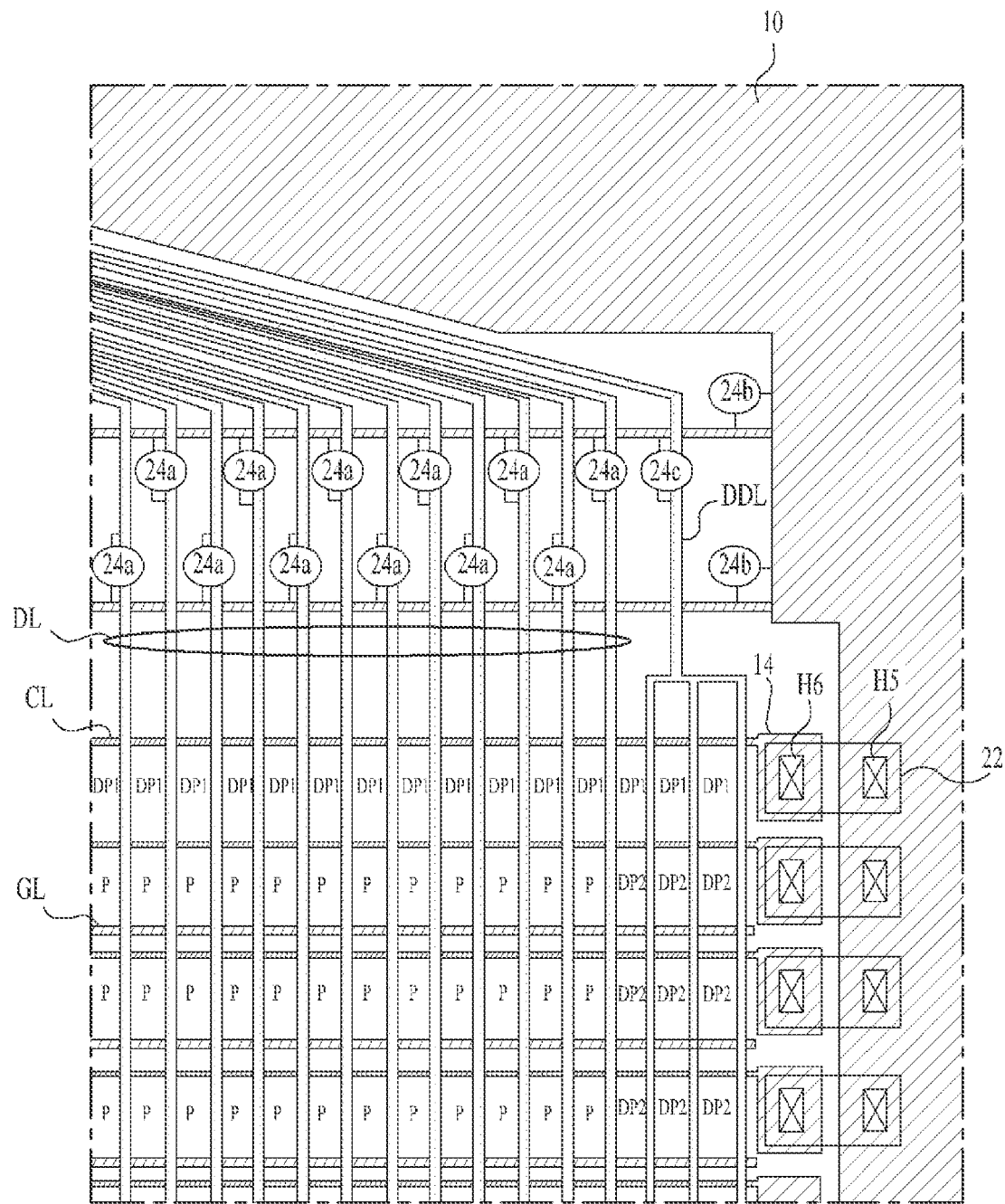
FIG. 3 is an enlarged view illustrating a region B of the liquid crystal panel shown in FIG. 1.

The common voltage supplier 8 supplies a common voltage Vcom through the first to third gate metals 10, 12 and 14, and the source-drain metal 16 disposed in the dummy region DA to the common lines CL (see FIGS. 2 and 3)

In particular, in this embodiment, resistance deviation between routes along which a common voltage Vcom is supplied to the common lines CL is reduced, and breaking of lines or damage of the thin film transistor TFT that may result from intensive supply of high-voltage electrostatic discharge can thus be prevented.

Hereinafter, a route along which a common voltage Vcom is supplied to a plurality of common lines CL will be described in detail.

FIG. 2 is an enlarged view illustrating a region A of the liquid crystal panel 2 shown in FIG. 1. FIG. 3 is an enlarged view illustrating a region B of the liquid crystal panel shown in FIG. 1.

Referring to FIGS. 2 and 3, a plurality of gate lines GL are arrayed in a first direction (for example, horizontal direction) and a plurality of data lines DL are arrayed in a second direction (for example, vertical direction) perpendicular to the first direction. Also, a plurality of common lines CL are arrayed in the first direction such that they are parallel to the gate lines GL.

A plurality of dummy pixels (DP) include a plurality of first dummy pixels DP1 arrayed in the first direction, and a plurality of second dummy pixels DP2 arrayed in the second direction.

The first dummy pixels DP1 are disposed in upper and lower parts of the display region AA such that they are adjacent to the pixels P arrayed in the first and last lines. The second dummy pixels DP2 are disposed in left and right parts of the display region AA such that they are adjacent to the pixels P arrayed in the first and last lines. Although an example in which the second dummy pixels DP2 are disposed in three lines is illustrated in FIGS. 2 and 3, the second dummy pixels DP2 may be disposed in several lines. For reference, the first dummy pixels DP1 are connected to the common lines CL, but are not connected to the gate lines GL.

Meanwhile, as described above, the first to third gate metals 10, 12 and 14 and the source-drain metal 16 are disposed in the dummy region DA, which will be described below.

The first gate metal 10 is formed at the periphery of the dummy region DA and is electrically connected to a pad unit (not shown) electrically connected to the common voltage supplier 8. The second gate metal 12 extends from the common lines CL to one side (for example, left side) to form a pad shape. The third gate metal 14 extends from the common lines CL to the other side (for example, right side) to form a pad shape. The first to third gate metals 10, 12 and 14 and the common lines CL may be made of the same material in the same layer as the gate lines GL.

Referring to FIG. 2, the source-drain metal 16 is disposed in the second direction at one side of the second gate metals 12. The source-drain metal 16 may be for example disposed between a gate pad unit (not shown) and the second gate pads 12. In this case, the source-drain metal 16 may be formed of the same material in the same layer as the data line DL in order to prevent short circuit between the source-drain metal 16 and the gate line GL.

Meanwhile, the first gate metal 10 electrically connects the source-drain metal 16, the source-drain metal 16 electrically connects the second gate metal 12, and the first gate metal 10 electrically connects the third gate metal 14. Accordingly, the common voltage Vcom applied from the common voltage supplier 8 to the first gate metal 10 is applied to the common lines CL and, as a result, may be applied to the first and second dummy pixels DP1 and DP2, and the pixels P.

Specifically, the first gate metal 10 and the source-drain metal 16 are electrically connected to each other by which the first and second contact holes H1 and H2 exposing the first gate metal 10 and the source-drain metal 16, respectively, are covered with the first connection pattern 18. Here, the first contact hole H1 passes through the protective film and the gate insulating film and exposes a part of the first gate metal 10, and the second contact hole H2 passes through the protective film and exposes a part of the source-drain metal 16. The first connection pattern 18 may be formed of the same material in the same layer as the pixel electrode.

Also, the source-drain metal 16 and the second gate metal 12 are electrically connected to each other, by which the third and fourth contact holes H3 and H4 (exposing the source-drain metal 16 and the second gate metal 12, respectively) are covered with the second connection pattern. Here, the third contact hole H3 passes through the protective film and exposes a part of the source-drain metal 16, and the fourth contact hole H4 passes through the protective film and the gate insulating film and exposes a part of the second gate metal 12. The second connection pattern 20 may be formed of the same material in the same layer as the pixel electrode of the pixel region.

As shown in FIG. 3, the first gate metal 10 and the third gate metal 14 are electrically connected to each other by which the fifth and sixth contact holes H5 and H6, exposing the first gate metal 10 and the third gate metal 14, respectively, are covered with the third connection pattern 22. Here, the fifth contact hole H5 passes thorough the protective film and the gate insulating film and exposes a part of the first gate metal 10, and the sixth contact hole H6 passes through the protective film and the gate insulating film and exposes a part of the third gate metal 16. The third connection pattern 22 may be formed of the same material in the same layer as the pixel electrode of the pixel region.

That is, a route along which a common voltage Vcom is introduced into the common lines CL will be summarized below. The common voltage Vcom is applied to one side of each common line CL via the first gate metal 10, the first connection pattern 18, the source-drain metal 16, the second connection pattern 20 and the second gate metal 12 in this order. Also, the common voltage Vcom is applied to the other side of each common line CL via the first gate metal 10, the third connection pattern 22 and the third gate metal 14 in this order.

As such, in this embodiment, a common voltage Vcom jumps through the first to third gate metals 10, 12 and 14 and the source-drain metal 16 and is thus supplied to the common lines CL. Accordingly, resistance deviation between routes of common voltages Vcom introduced into the common lines CL can be reduced, and a problem in which electrostatic discharge is intensively introduced into the common lines CL can be prevented.

Figure 5:
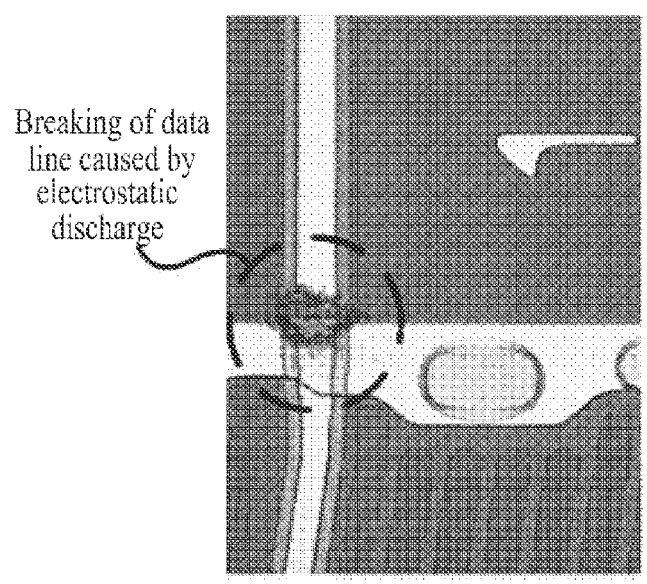
FIG. 5 illustrates an example in which electrostatic discharge shock is concentrated in a specific common line, causing breaking of the data line.

For reference, electrostatic discharge flows to parts having relatively low resistance. Electrostatic discharge is readily introduced into the first gate metal 10 since the first gate metal 10 has a large area. The electrostatic discharge introduced into the first gate metal 10 may be introduced into common lines CL electrically connected to the first gate metal 10. A resistance deviation between the first gate metal 10 and the common line CL may be generated when an electric connection route therebetween is not identical. As a result, the electrostatic discharge introduced into the first gate metal 10 intensively flows to common lines CL having a relatively low resistance. As such, when electrostatic discharge shock is concentrated in specific common lines CL, the corresponding common lines CL may be damaged, or data lines DL that intersect the common lines CL may be damaged. FIG. 5 illustrates an example in which electrostatic discharge shock is concentrated in specific common lines CL, causing breaking of the data line DL. In accordance with the present invention, electric connection routes between the first gate metals 10 and the common lines CL are identical, concentration of electrostatic discharge shock in specific common lines CL can be prevented and, as a result, breaking of lines or damage of the thin film transistor TFT can be prevented.

Meanwhile, in this embodiment, the liquid crystal display device includes a plurality of anti-electrostatic discharge circuits in order to reduce damage of signal lines and thin film transistors from electrostatic discharge, and this configuration will be described in detail.

Referring to FIGS. 2 and 3, the dummy region DA further includes a dummy data line DDL, a dummy common line DCL and a plurality of anti-electrostatic discharge circuits.

The dummy data line DDL is disposed in the first direction such that it is adjacent to the first and last data lines DL. The dummy data line DDL branches into three dummy data lines DDL such that the dummy data lines correspond to second dummy pixels DP2 disposed in three lines, and is thus connected to the second dummy pixels DP2.

The dummy common line DCL branches from the first gate metal 10 in a second direction, and intersects the dummy data line DDL and the data lines DL. The number of such a dummy common line DCL may be at least one.

The anti-electrostatic discharge circuits include first to fourth anti-electrostatic discharge circuits 24a to 24d.

The first anti-electrostatic discharge circuit 24a protects damage of the data line DL from the electrostatic discharge shock. For this purpose, the first anti-electrostatic discharge circuit 24a is disposed between the data line DL and the dummy common line DCL and is connected thereto.

The second anti-electrostatic discharge circuit 24b prevents damage of the dummy common line DCL from the electrostatic discharge shock. For this purpose, the second anti-electrostatic discharge circuit 24b is disposed between the dummy common line DCL and the first gate metal 10 and is connected thereto.

The third anti-electrostatic discharge circuit 24c prevents damage of the dummy data line DDL from the electrostatic discharge shock. For this purpose, the third anti-electrostatic discharge circuit 24c is disposed between the dummy data line DDL and the dummy common line DCL and is connected thereto.

The fourth anti-electrostatic discharge circuit 24d prevents damage of the gate line GL from the electrostatic discharge shock. For this purpose, the fourth anti-electrostatic discharge circuit 24d is disposed between the gate line GL and the source-drain metal 16 and is connected thereto.

Figure 4:
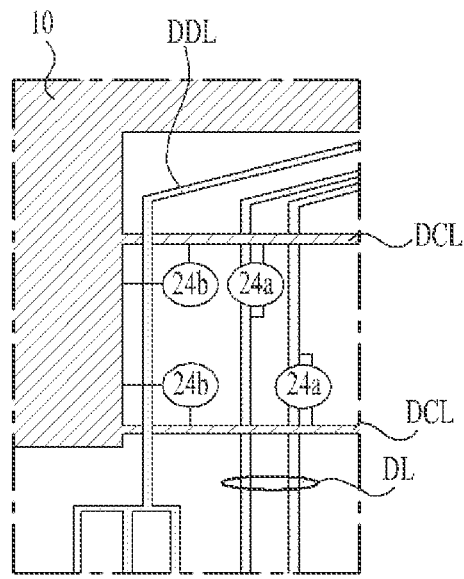
FIG. 4 is a comparative example illustrating the effects of the present invention.

In particular, this embodiment is characterized in that the dummy data line DDL is disposed between the second and third anti-electrostatic discharge circuits 24b and 24c. When the dummy data line DDL is disposed between the first gate metal 10 and the second anti-electrostatic discharge circuit 24b, as shown in FIG. 4, the dummy data line DDL may be readily damaged due to electrostatic discharge introduced into the dummy common line DCL from the first gate metal 10. In accordance with the present invention, damage of the dummy data line DDL can be prevented by disposing the dummy data line DDL between the second and third anti-electrostatic discharge circuits 24b and 24c.

Hereinafter, a method for fabricating the liquid crystal display device according to one embodiment of the present invention will be described in detail.

In accordance with a thin film transistor array substrate of a liquid crystal panel 2 according to the present embodiment, a plurality of gate lines GL, a plurality of common lines CL and first to third gate metals 10, 12 and 14 are formed of the same material in the same layer, as described above. Also, the data lines DL and the source-drain metal 16 are formed of the same material in the same layer, and the pixel electrode and the first to third connection patterns 18, 20 and 22 are formed of the same material in the same layer.

Figure 6:
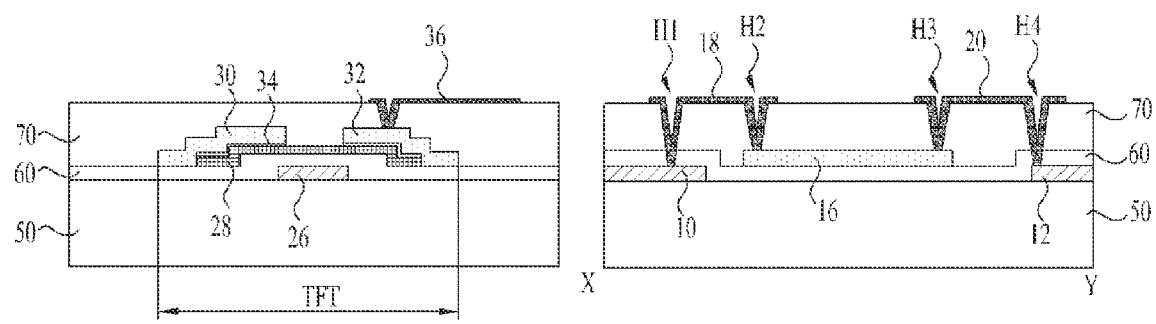
FIG. 6 is a schematic sectional view illustrating a thin film transistor TFT included in the pixel region and a sectional view taken along the line X-Y of the TFT shown in FIG. 2.

That is, the first to third gate metals 10, 12 and 14, the source-drain metal 16 and the first to third connection patterns 18, 20 and 22 according to the embodiment are formed simultaneously with the thin film transistor provided in the pixel region, thus requiring no separate mask process for forming these elements. Hereinafter, a process for fabricating the thin film transistor TFT included in the pixel region will be provided for convenience of description. FIG. 6 is a schematic sectional view illustrating a thin film transistor TFT included in the pixel region and a sectional view taken along the line X-Y of the TFT shown in FIG. 2. A method for fabricating the liquid crystal display device will be described below with reference to FIG. 6.

First, a gate metal layer is formed on a substrate 50 using a metal and is then patterned to form a plurality of gate patterns. The gate patterns include a plurality of gate lines GL and a gate electrode 26 that protrudes from the gate lines GL corresponding to the pixel region. The gate patterns further include the first to third gate metals 10, the common lines CL and the dummy common lines DCL.

Next, a gate insulating film 60 is formed on the substrate 50 including the gate patterns using an inorganic insulating material such as silicon nitride (SiN$_x$) or silicon oxide (SiO$_2$).

Also, a semiconductor layer 28 containing pure amorphous silicon and an ohmic contact layer 34 containing impure amorphous silicon are stacked on the gate insulating film 60. At this time, the semiconductor layer 28 and the ohmic contact layer 34 are formed as an island in a region that overlaps the gate electrode 26.

Next, a source-drain metal layer is formed on the substrate 50 including the semiconductor layer 28 and the ohmic contact layer 34 using one selected from a conductive metal group, and is then patterned to form a plurality of source-drain patterns. The source-drain patterns include a plurality of data lines DL, a source electrode 30 connected to a plurality of data lines DL corresponding to the pixel region, and a drain electrode 32 spaced from the source electrode 30 such that the gate electrode 26 is disposed between the drain electrode 32 and the source electrode 30. The source-drain patterns further include the source-drain metal 16 and dummy data lines DDL.

Next, the ohmic contact layer 34 exposed between the source and drain electrodes 30 and 32 is removed to expose the semiconductor layer 28.

Next, a protective film 70 is formed on the substrate 50 including the source-drain pattern using an inorganic insulating material selected from the group consisting of silicon nitride (SiNx) or silicon oxide (SiO$_2$), or an organic insulating material selected from benzocyclobutene (BCB) and an acryl resin.

The protective film 70 and the gate insulating film 60 are selectively removed to form a pixel contact hole that exposes the drain electrode 32 and the afore-mentioned first to sixth contact holes H1 to H6.

Next, a transparent conductive metal selected from the group consisting of indium-tin-oxide (ITO) and indium-zinc-oxide (IZO) is deposited on the resulting structure and patterned to form a plurality of transparent patterns. The transparent patterns include a pixel electrode 36 that covers the pixel contact hole and a common electrode (not shown) that forms an electric field with the pixel electrode 36. The transparent patterns further include the afore-mentioned first to third connection patterns 18, 20, and 22.

Meanwhile, the afore-mentioned first to fourth anti-electrostatic discharge circuits 24a to 24d include a plurality of thin film transistors. The thin film transistors are also formed simultaneously with thin film transistors provided in the pixel region.

As such, in this embodiment, the first to third gate metals 10, 12 and 14, the source-drain metal 16 and the first to third connection patterns 18, 20 and 22 are formed simultaneously with thin film transistors provided in the pixel region, thus requiring no separate mask process for forming these elements.

Meanwhile, this embodiment can reduce product defects caused by electrostatic discharge generated during manufacture of the thin film transistor array substrate and thus improve yield, based on the configurations shown in FIGS. 2 and 3. Specifically, in the process of fabricating the thin film transistor, deposition of an inorganic insulating material or pure amorphous silicon is carried out by chemical vapor deposition (CVD) and dry etching is used to pattern a variety of metal layers. During CVD or dry etching, a great amount of electrostatic discharge may be generated. As described above, the electrostatic discharge may be intensively concentrated in specific lines among the common lines CL. In particular, during an etching process for selectively removing the deposited protective film 50 or a process for forming the transparent pattern, electrostatic discharge shock is readily concentrated in specific common lines CL, since this process is performed after the gate patterns are formed. In accordance with the present invention, product defects caused by electrostatic discharge generated during the production process such as CVD or dry etching can be reduced based on the configurations shown in FIGS. 2 and 3.

As apparent from the fore-going, the present invention reduces resistance deviation between routes through which a common voltage is supplied to a plurality of common lines, thus preventing breaking of lines or damage of thin film transistors that may result from intensive supply of high-voltage electrostatic discharge to specific common lines. Also, the present invention changes a design of dummy data lines, thus reducing electrostatic discharge shock of dummy data lines and preventing breaking of the lines or damage of the thin film transistors.

The present invention improves product reliability during driving of the products and reduces product defects caused by a great amount of electrostatic discharge generated during manufacture of thin film transistors, thus advantageously increasing product yield and reducing production cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display device comprising:
    a plurality of pixels defined by intersections between a plurality of gate lines and a plurality of data lines;
    a plurality of dummy pixels disposed along a circumference of the plurality of pixels;
    a plurality of common lines disposed parallel to the plurality of gate lines, the plurality of common lines being connected to the plurality of pixels and the plurality of dummy pixels;
    a first gate metal to receive an exterior common voltage;
    a plurality of second gate metals that extend from the plurality of common lines to one side, the plurality of second gate metals having a pad shape;
    a source-drain metal disposed in a direction parallel to the plurality of data lines at one side of the plurality of second gate metals;
    a first connection pattern to electrically connect the first gate metal to the source-drain metal;
    a second connection pattern to electrically connect the source-drain metal to the plurality of second gate metals;
    a plurality of third gate metals that extend from the plurality of common lines to another side, the plurality of third gate metals having a pad shape; and
    a third connection pattern to electrically connect the first gate metal to the plurality of third gate metals.

2. The liquid crystal display device according to claim 1, wherein the first to third gate metals and the plurality of common lines are formed of a same material in a same layer as the plurality of gate lines.

3. The liquid crystal display device according to claim 1, wherein the source-drain metal is formed of a same material in a same layer as the plurality of data lines.

4. The liquid crystal display device according to claim 1, wherein the first to third connection patterns are formed of a same material in a same layer as a pixel electrode provided in the plurality of pixels.

5. The liquid crystal display device according to claim 1, further comprising:
    a dummy data line formed parallel to the plurality of data lines so as to be adjacent to the first and last data lines;
    a dummy common line that branches from the first gate metals in a direction parallel to the plurality of gate lines, the dummy common line intersecting the plurality of data lines and the dummy data line;
    a first anti-electrostatic discharge circuit interposed between the plurality of data lines and the dummy common line, the first anti-electrostatic discharge circuit being connected thereto;
    a second anti-electrostatic discharge circuit interposed between the dummy common line and the first gate metal, the second anti-electrostatic discharge circuit being connected thereto; and
    a third anti-electrostatic discharge circuit interposed between the dummy data line and the dummy common line, the third anti-electrostatic discharge circuit being connected thereto,
    wherein the dummy data line is disposed between the second and third anti-electrostatic discharge circuits.

6. The liquid crystal display device according to claim 5, further comprising:
    a fourth anti-electrostatic discharge circuit interposed between the plurality of gate lines and the source-drain metal, the fourth anti-electrostatic discharge circuit being connected thereto.

* * * * *